(12) United States Patent
Barr et al.

(10) Patent No.: US 7,141,742 B2
(45) Date of Patent: Nov. 28, 2006

(54) ALTERNATING VOIDED AREAS OF ANTI-PADS

(75) Inventors: Andew Harvey Barr, Roseville, CA (US); Dale John Shidla, Roseville, CA (US); Robert William Dobbs, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 100 days.

(21) Appl. No.: 10/621,925

(22) Filed: Jul. 17, 2003

(65) Prior Publication Data

US 2005/0011676 A1    Jan. 20, 2005

(51) Int. Cl.
*H01R 12/04* (2006.01)
*H05K 1/00* (2006.01)
*H05K 3/36* (2006.01)
*H01K 3/10* (2006.01)

(52) U.S. Cl. .......................... 174/262; 29/830; 29/852
(58) Field of Classification Search ........ 174/262–266; 361/792–795, 816–818; 29/830, 846, 852
See application file for complete search history.

(56) References Cited

U.S. PATENT DOCUMENTS

| 6,229,095 B1 * | 5/2001 | Kobayashi | ................. 174/255 |
| 6,366,466 B1 | 4/2002 | Leddige et al. | |
| 6,538,538 B1 | 3/2003 | Hreish et al. | |
| 6,710,258 B1 * | 3/2004 | Oggioni et al. | ............. 174/255 |
| 2002/0130737 A1 | 9/2002 | Hreish et al. | |

FOREIGN PATENT DOCUMENTS

| GB | 2 374 984 | 10/2002 |
| JP | 2003-309378 | 10/2003 |

OTHER PUBLICATIONS

A copy of GB Search Report for Application No. GB0415345.8 mailed on Nov. 15, 2004 (3 pages).

* cited by examiner

*Primary Examiner*—Kamand Cuneo
*Assistant Examiner*—Jeremy C. Norris

(57) ABSTRACT

A printed circuit board includes a first conductive plane and a second conductive plane substantially parallel to the first conductive plane. The printed circuit board includes a via signal barrel transecting the first and second conductive planes and a first anti-pad positioned between the first conductive plane and the via signal barrel. The first anti-pad has a first voided area. The printed circuit board includes a second anti-pad positioned between the second conductive plane and the via signal barrel. The second anti-pad has a second voided area. The first voided area does not completely overlap the second voided area.

31 Claims, 3 Drawing Sheets

ALTERNATING VOIDED AREAS OF ANTI-PADS

BACKGROUND

High speed serial communications implemented on printed circuit boards (PCBs) are becoming increasingly popular for high bandwidth data transfer. PCBs typically are made up of multiple layers or planes including power planes, ground planes, and signal planes. Vias are employed to route traces for transmitting signals from the top layer of a PCB to a lower layer of a PCB, or to route traces from one layer to another layer within the PCB. Vias are conductors that connect traces from one layer in a PCB to traces in another layer in a PCB. When vias pass through a power or ground plane, the conducting material around the via on the power or ground plane is removed to prevent a short between the via and the power or ground plane. The area that is removed creates a void called an anti-pad.

A stray or parasitic capacitance is formed between the via barrel and the conductive material of the power or ground plane near the via barrel. This stray capacitance is inversely proportional to the size and surface area of the anti-pad. In other words, as the size and surface area of the anti-pad increases, the stray capacitance decreases, and as the size and surface area of the anti-pad decreases, the stray capacitance increases. For low speed signals, such as signals less than approximately 2 GHz, the stray capacitance typically does not have an appreciable effect on signal integrity. As signal speeds increase to greater than approximately 2 GHz, however, the stray capacitance has an increasingly more significant effect on signal integrity. Therefore, it is desirable to reduce the stray capacitance when transmitting high speed signals through vias on PCBs.

Various approaches have been proposed to reduce the stray capacitance. One approach is to increase the size of the anti-pad. This approach, however, can result in non-planarity issues of layers or planes within PCBs. Non-planarity typically occurs during the manufacturing of a PCB when dielectric material settles into the voided area of the anti-pad. The settled dielectric material causes dips on the board surface around the via, thereby reducing the planarity of the board surface. As the anti-pad size is increased to reduce stray capacitance, the non-planarity of the PCB also increases due to the increased voided anti-pad area in which dielectric material settles.

Increasing the size of the anti-pad may also lead to a choking off of power or ground planes in areas where there are many vias situated close together, such as where an integrated circuit is mounted to a PCB. Power or ground planes can be choked off when too much conductive material is removed from the power or ground planes to form the anti-pads of increased size. The choking off of power or ground planes typically prevents signal traces running between the vias on adjacent signal layers from having a good power or ground reference on the power or ground layer where the anti-pads are formed.

Other approaches reduce the stray capacitance by removing or not fabricating unused portions of the via. The stray capacitance is reduced by decreasing the number of power or ground planes that a via must pass through. One such approach uses blind vias or buried vias, which are vias that do not pass completely through a PCB. The disadvantages of this approach are that blind or buried vias may increase fabrication costs and may not support known soldering techniques, such as pin-in-hole soldering techniques. Another approach utilizes a drill to counter bore and remove unused portions of a via. A disadvantage of this approach is an increase in fabrication costs.

Another approach takes an entirely different avenue to dealing with stray capacitance. Rather than attempting to minimize the stray capacitance, this approach actually increases the capacitance to set values. The set values of capacitance are used in an attempt to optimize the frequency response characteristics of a via or as part of a filter for signals transmitted through the via. The disadvantage of this approach is that different via and anti-pad designs are required based upon the signal that will be transmitted through the via.

High speed signals on a PCB commonly originate within an integrated circuit such as an application specific integrated circuit (ASIC) mounted to the PCB. The integrated circuit may be mounted to the PCB in any number of ways, including using different soldering techniques and sockets that allow the integrated circuit to be removed and remounted on the PCB. To mount integrated circuits to a PCB, the planarity of the PCB must be maintained to a tight tolerance to maintain a high integrity signal between the integrated circuit and the PCB. Non-planarity of the PCB reduces this tight tolerance and therefore the integrity of the signal.

For reasons stated above and for other reasons presented in the present specification, there is a need for a PCB that includes anti-pad designs associated with vias that will minimize capacitance, maximize board planarity, and minimize signal trace routing issues, thereby allowing high speed serial communications regardless of the environment or application.

SUMMARY

One aspect of the present invention provides a printed circuit board. The printed circuit board comprises a first conductive plane and a second conductive plane substantially parallel to the first conductive plane. The printed circuit board comprises a via signal barrel transecting the first and second conductive planes and a first anti-pad positioned between the first conductive plane and the via signal barrel. The first anti-pad has a first voided area. The printed circuit board comprises a second anti-pad positioned between the second conductive plane and the via signal barrel. The second anti-pad has a second voided area. The first voided area does not completely overlap the second voided area.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following Detailed Description, therefore, is not to be taken in a limiting sense, and the scope of the present invention is defined by the appended claims.

Vias in (PCBs) route signals from one layer within a PCB to another layer within the PCB. Anti-pads are employed to create a void between the via and the conductive plane to prevent shorts between the vias and conductive planes through which vias may pass.

Figure 1:
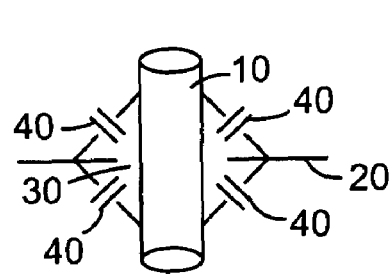
FIG. 1 is a diagram illustrating an exemplary embodiment of a via and stray capacitance associated with the via.

FIG. 1 is a diagram illustrating an exemplary embodiment of a vertical cross section of a printed circuit board (PCB) including via barrel 10, conductive plane 20, anti-pad 30, and a representation of stray capacitance 40. In one embodiment conductive plane 20 is a power, and in another embodiment conductive plane 20 is a ground plane. In one embodiment, conductive plane 20 is fabricated from copper or a copper alloy. In other embodiments, conductive plane 20 is fabricated from any suitable conductive material or from any suitable alloy including conductive material.

As illustrated in FIG. 1, via barrel 10 is perpendicular to and passes through conductive plane 20. Via barrel 10, however, can be oriented at any suitable angle with respect to conductive plane 20. The void between via barrel 10 and conductive plane 20 is anti-pad 30.

Anti-pad 30 is formed by removing the conductive material from conductive plane 20 around via barrel 10 using any suitable process. In one embodiment, the conductive material is removed by using a known etching process. Stray capacitance 40 represents the stray capacitance between via barrel 10 and conductive plane 20. Stray capacitance is undesirable in the transmission of high speed signals, such as signals greater than approximately 2 GHz. Specifically, stray capacitance reduces the integrity of high speed signals transmitted within and through a PCB. Stray capacitance 40 is inversely proportional to the size and surface area of anti-pad 30. As the size and surface area of anti-pad 30 are increased, stray capacitance 40 decreases. Conversely, as the size and surface area of anti-pad 30 are decreased, stray capacitance 40 increases.

Figure 2:
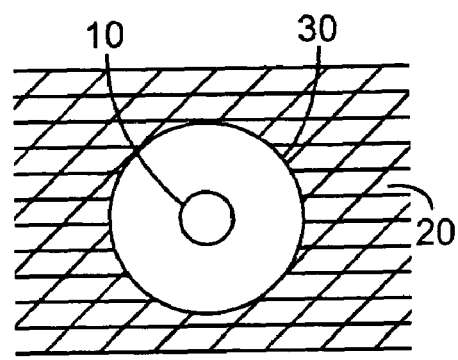
FIG. 2 is a diagram illustrating an exemplary embodiment of a cross section of a via and an associated anti-pad.

FIG. 2 is a diagram illustrating an exemplary embodiment of a cross section of via 10, anti-pad 30, and conductive plane 20. Anti-pad 30 forms a void in conductive plane 20 around via 10. In one embodiment, via 10 and anti-pad 30 are substantially circular in shape. In other embodiments, via 10 and anti-pad 30 may be other shapes, such as square, rectangular, or oblong. Increasing the size of anti-pad 30 can result in non-planarity issues of layers or planes within a PCB. For example, dielectric material may settle into the void in conductive plane 20 and lead to non-planarity of the PCB. As the size of the void is increased, non-planarity of the PCB increases. Conversely, as the size of the void is decreased, non-planarity of the PCB decreases.

Figure 3:
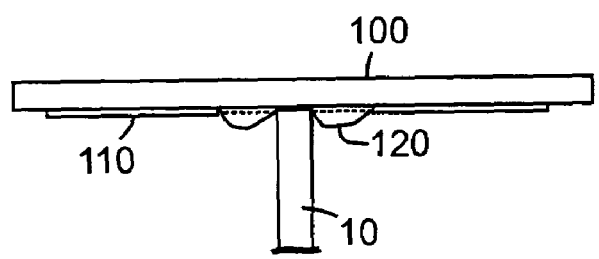
FIG. 3 is a diagram illustrating an exemplary embodiment of non-planarity issues associated with a prior art PCB.

FIG. 3 is a diagram illustrating an exemplary embodiment of an integrated circuit 100 mounted on a surface of a PCB 110. FIG. 3 further illustrates planarity issues associated with anti-pads. Dips 120 around via 10 are formed during manufacturing when dielectric material settles into the voided power or ground plane area of anti-pad 30, shown in FIG. 2. Dips 120 cause PCB 110 to be non-planer. The non-planarity increases as the size of anti-pad 30 increases. The non-planarity increases because the size of the void, which defines anti-pad 30, increases, thereby leaving more voided area in which dielectric material settles into. The non-planarity prevents integrated circuit 100 from being properly mounted to PCB 110. An improper mounting of integrated circuit 100 on PCB 110 decreases the signal integrity between integrated circuit 100 and PCB 110.

Figure 4:
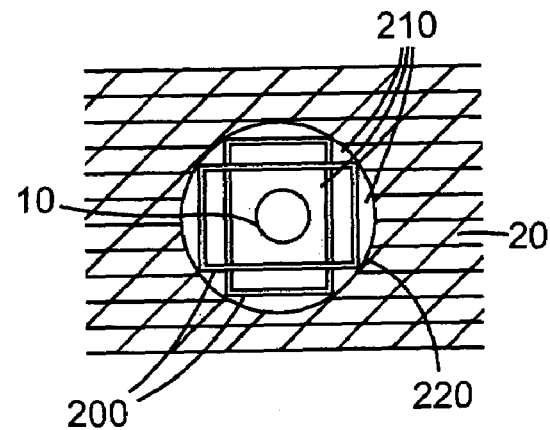
FIG. 4 is a diagram illustrating an exemplary embodiment of a cross section of a via and an associated partially voided anti-pad.

FIG. 4 is a diagram illustrating an exemplary embodiment of partially voided anti-pad 220 having non-voided areas 200 and voided areas 210. Conductive plane 20 can be made of copper, a copper alloy, or any suitable conductive material or alloy including a conductive material. In one embodiment, partially voided anti-pad 220 is formed by partially removing the conductive material from conductive plane 20 around via 10. In another embodiment, partially voided anti-pad 220 is formed by first completely removing the conductive material from conductive plane 20 around via 10, and then placing conductive material around via 10 to create non-voided areas 200. In one embodiment, the conductive material of non-voided areas 200 is electrically connected to the conductive material of conductive plane 20. In another embodiment, the conductive material of non-voided areas 200 is not electrically connected to the conductive material of conductive plane 20.

In one embodiment, the pattern formed by non-voided areas 200 of anti-pad 220 is a cross hatching pattern. In other embodiments, the pattern formed by non-voided areas 200 of anti-pad 220 is another suitable pattern, such as circular, screen, concentric circles, radial spokes, or an arbitrary pattern. The pattern can be a symmetric or asymmetric pattern. Partially voided anti-pad 220 provides a support structure to maintain the planarity of the PCB by preventing dielectric material from settling into anti-pad voids 210. With patterned partially voided anti-pad 220, dips 120, shown in FIG. 3, can be reduced, minimized, or eliminated.

The stray capacitance associated with an anti-pad is inversely proportional to the surface area of removed conductive material within an anti-pad. As the amount of conductive material removed from conductive plane 20 near via 10 increases, stray capacitance 40 decreases. A partially voided anti-pad enables more conductive material to be removed from the conductive plane than the fully voided anti-pad of FIG. 2. More conductive material can be removed from a partially voided anti-pad by increasing the size of the anti-pad and leaving behind a pattern of conductive material to support the PCB. In this fashion, stray capacitance 40 is reduced while board planarity is maintained. The size of the anti-pad can therefore be increased without the previous disadvantage of decreasing board planarity.

Figure 5:
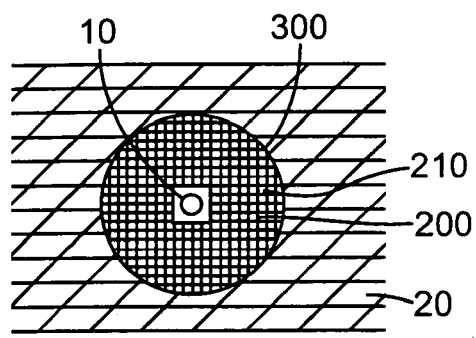
FIG. 5 is a diagram illustrating another exemplary embodiment of a cross section of a via and an associated partially voided anti-pad.

FIG. 5 is a diagram illustrating another exemplary embodiment including anti-pad 300 on conductive plane 20 around via 10. In this embodiment, the pattern for partially voided anti-pad 300 is a screen pattern. The partially voided anti-pad 300 has non-voided areas 200 and voided areas 210. A screen pattern results in significant removal of the conductive material from a conductive plane 20, indicated at 210, to reduce stray capacitance 40, while providing adequate support from material 200 to reduce settlement of dielectric material to maintain board planarity.

A desired pattern of conductive material for particular PCB anti-pads can be determined by balancing various factors including but not limited to: costs, manufacturing technologies, stray capacitance tolerances, and PCB non-planarity tolerances. There are a series of design tradeoffs to be made between these factors. For example, if the stray capacitance is reduced by removing more conductive material from an anti-pad, thereby leaving less conductive material for support, board planarity is more likely to become an issue. Based upon the tradeoffs between these items, the pattern for a particular anti-pad can include any suitable pattern or combination of patterns, such as concentric circles, either connected or not connected, radial spokes, stars, cross hatches, screens, or an arbitrary or random pattern.

Figure 6:
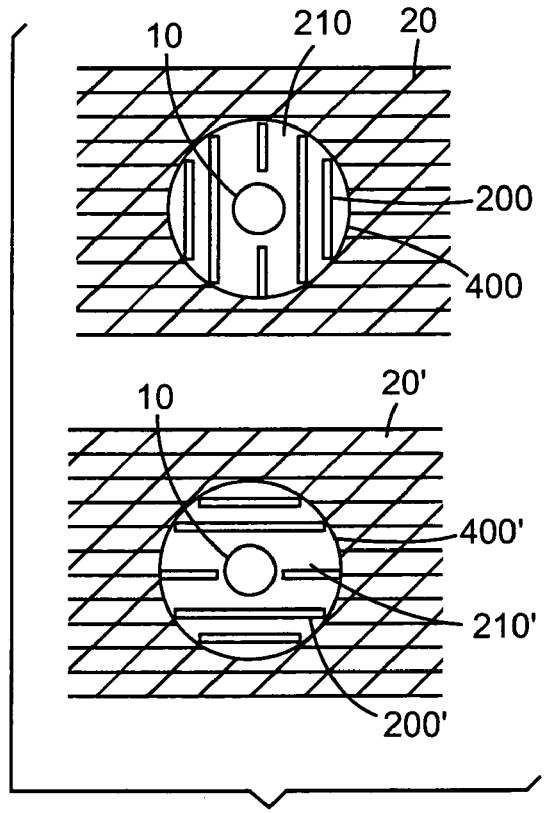
FIG. 6 is a diagram illustrating an exemplary embodiment of a cross section of a via and patterned partially voided anti-pads on parallel conductive planes.

FIG. 6 is a diagram illustrating an exemplary embodiment of offset or rotated partially voided patterned anti-pads 400 and 400' on substantially parallel conductive planes 20 and 20'. Via 10 transects both conductive planes 20 and 20'. The partially voided anti-pads 400 and 400' have non-voided areas 200 and 200' and voided areas 210 and 210'. In one embodiment, partially voided anti-pads 400 and 400' are substantially perpendicular to each other. In other embodiments, partially voided anti-pads 400 and 400' can be in any suitable orientation relative to each other. The pattern formed by non-voided areas 200 and 200' of anti-pad 400 and 400' can be any suitable pattern. The pattern can be a symmetric or asymmetric pattern. Partially voided anti-pads 400 and 400' maintain the planarity of the PCB by preventing dielectric material from settling into voids 210 and 210' left when anti-pads 400 and 400' are formed. This is accomplished by leaving some conductive material 200 and 200' behind to support the dielectric material.

Modifying the orientation of patterned partially voided anti-pads 400 and 400' from conductive plane 20 to conductive plane 20' provides additional support to maintain board planarity. Anti-pads 400 and 400' are oriented so that void 210 on conductive plane 20 is at least partially supported by conducting material 200' on conductive plane 20'. Stated another way, voided areas 210 and 210' do not completely overlap each other. The surface area of anti-pads 400 and 400' can therefore be increased in size by increasing the amount of conductive material removed. The increased support of the layered structure and the increased voided surface area of anti-pads 400 and 400' reduce the stray capacitance while maintaining board planarity.

Figure 7:
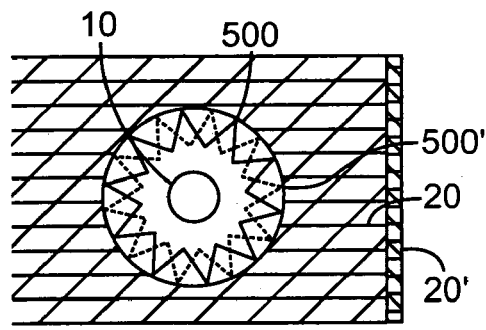
FIG. 7 is a diagram illustrating another exemplary embodiment of a cross section of a via and alternating patterned partially voided anti-pads on parallel conductive planes.

FIG. 7 is a diagram illustrating another exemplary embodiment of offset or rotated partially voided patterned anti-pads 500 and 500' on substantially parallel conductive planes 20 and 20'. Conductive plane 20' extends beyond conductive plane 20 in the Figure for illustrative purposes. Via 10 transects both conductive planes 20 and 20'. In this embodiment, a star pattern is used for partially voided anti-pads 500 and 500' associated with via 10. Anti-pads 500 and 500' are shown stacked as they would be in a PCB. On conductive plane 20, star patterned anti-pad 500, indicated with solid lines, has a first orientation. On conductive plane 20', which is substantially parallel to and stacked underneath conductive plane 20, star patterned anti-pad 500', indicated with dashed lines, has a second orientation. In one embodiment, the second orientation is rotated from the first orientation so that the points of the star patterns of anti-pads 500 and 500' are equidistance from each other. In other embodiments, the star patterns of anti-pads 500 and 500' may be oriented in any relation to each other. As described with reference to FIG. 6, the offsetting patterns of conductive material of the substantially parallel stacked anti-pads 500 and 500' allow for larger anti-pads, therefore reducing the stray capacitance while maintaining board planarity.

In other embodiments, different suitable voiding patterns can be used on different PCB layers. In an illustrative example embodiment, a first conductive plane has a first partially voided anti-pad in a ten point star pattern while a second partially voided anti-pad for the same via barrel on a second conductive plane has a partially voided anti-pad in a concentric circles pattern. Many other different suitable voiding patterns can be used on different PCB layers.

Figure 8:
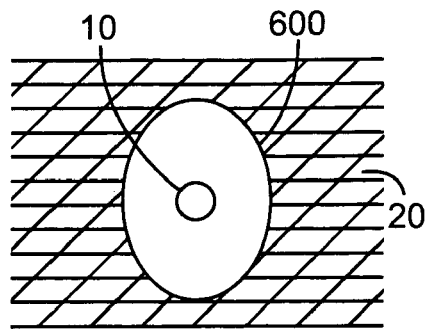
FIG. 8 is a diagram illustrating an exemplary embodiment of a cross section of a via and an anti-pad having a non round shape.

FIG. 8 is a diagram illustrating another exemplary embodiment of an anti-pad 600. Rather than being circular in shape as previously illustrated and described with reference to FIGS. 1–7, anti-pad 600 is longer in one direction than in another substantially perpendicular direction. In the illustrated embodiment, anti-pad 600 is oval shaped. In other embodiments, anti-pad 600 can be any suitable shape in which anti-pad 600 is longer in one direction than in another direction, such as a rectangle.

Anti-pad 600 is formed by removing conductive material from conductive plane 20 around via barrel 10. Via barrel 10 passes through anti-pad 600 and conductive plane 20.

Elongated anti-pad 600 reduces stray capacitance 40 as compared to the smaller area round anti-pad of FIG. 2. Stray capacitance 40 is reduced because the distance between via barrel 10 and conductive plane 20 is increased in the elongated direction and the total surface area of anti-pad 600 is increased.

Figure 9:
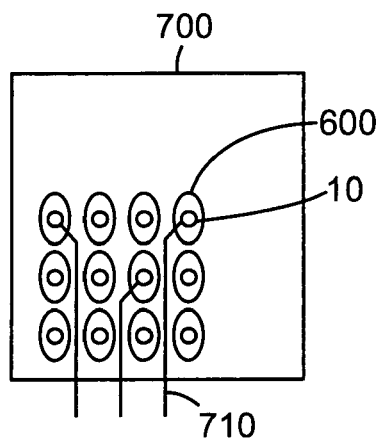
FIG. 9 is a diagram illustrating an exemplary embodiment of an integrated circuit via pin field.

FIG. 9 is a diagram illustrating an exemplary embodiment of a via pin field of an integrated circuit 700 using anti-pads 600 of FIG. 7. A via pin field can exist where an integrated circuit is mounted on a PCB. Signal traces 710 are illustrated on the same level as anti-pads 600 in FIG. 9 for clarity, however, signal traces 710 are typically on a parallel signal layer to conductive plane 20 where anti-pads 600 are formed.

Elongated anti-pads 600 allow for signal traces 710 to be routed between anti-pads 600 while still reducing stray capacitance 40.

To maintain signal integrity through signal trace 710 on a PCB, signal trace 710 can be placed on a signal layer immediately above or below a non-voided area of conductive plane 20. If signal trace 710 is routed above or below a voided area of conductive plane 20, such as above or below the voided area of anti-pad 600, noise can be introduced into signal trace 710 during circuit operation. If several anti-pads 600 situated close together are formed too large, conductive plane 20 between anti-pads 600 can be choked off which prevents the routing of signal traces 710 between anti-pads 600 on adjacent signal layers. Elongated anti-pads 600 allow signal traces 710 to be routed in at least one direction between anti-pads 600 while still increasing the size of anti-pads 600. Anti-pads 600 can be oriented in different suitable directions on different suitable areas of the PCB.

Figure 10:
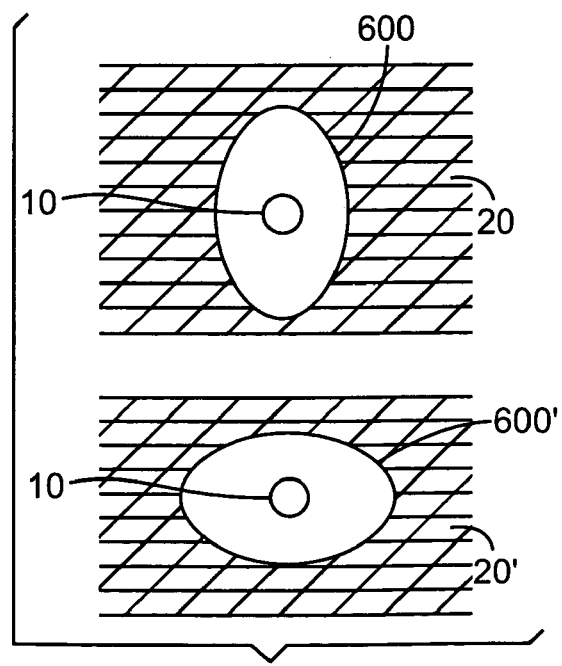
FIG. 10 is a diagram illustrating an exemplary embodiment of a cross section of a via and alternating anti-pad orientations on parallel conductive planes.

FIG. 10 is a diagram illustrating an exemplary embodiment of alternating the orientation of anti-pad 600 of FIG. 8 associated with via 10 from conductive plane 20 to conductive plane 20'. In one embodiment, anti-pads 600 and 600' are oriented substantially perpendicular to each other. In other embodiments, anti-pads 600 and 600' have other suitable orientations relative to each other. The alternating orientation reduces stray capacitance 40 by increasing the size of anti-pad 600 and supports board planarity by reducing the size of the voided area that is aligned between conductive plane 20 and conductive plane 20'. Stated another way, the voided areas of anti-pads 600 and 600' do not completely overlap each other. Board planarity is supported by reducing the amount of dielectric material that settles into the voided areas of anti-pads 600 and 600'.

Alternating or offsetting the orientation of partially voided anti-pads or elongated anti-pads enables signal integrity to be maintained for high speed signals, such as signals from approximately 2 GHz and higher, which are transmitted through vias. In addition, the added support structure from the alternating patterns of conductive material in the anti-pads between layers of a PCB maintains board planarity. Thus, integrated circuits that generate high speed signals can be mounted on the PCB without reducing the signal integrity between the integrated circuit and the PCB due to either stray capacitance or board non-planarity.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A printed circuit board comprising:
   a first conductive plane;
   a second conductive plane substantially parallel to the first conductive plane;
   a via signal barrel transecting the first and second conductive planes;
   a first anti-pad positioned between the first conductive plane and the via signal barrel, the first anti-pad having a first voided area and a first non-voided area; and
   a second anti-pad positioned between the second conductive plane and the via signal barrel, the second anti-pad having a second voided area and a second non-voided area;
   wherein the first voided area does not completely overlap the second voided area.

2. The printed circuit board of claim 1, wherein the first conductive plane comprises one of a power plane and a ground plane.

3. The printed circuit board of claim 1, wherein the second conductive plane comprises one of a power plane and a ground plane.

4. The printed circuit board of claim 1, wherein the first and second anti-pads are longer in a first direction than in a second direction.

5. The printed circuit board of claim 1, wherein the first and second anti-pads are partially voided anti-pads.

6. The printed circuit board of claim 1, wherein the first and second anti-pads are configured to maintain board planarity.

7. The printed circuit board of claim 1, wherein the first and second anti-pads are configured for signals through the via signal barrel greater than approximately 2 GHz.

8. A printed circuit board comprising:
   a first conductive plane;
   a second conductive plane substantially parallel to the first conductive plane;
   a via signal barrel transecting the first and second conductive planes;
   a first partially voided anti-pad positioned between the first conductive plane and the via signal barrel, the first partially voided anti-pad having a first pattern and a first orientation; and
   a second partially voided anti-pad positioned between the second conductive plane and the via signal barrel, the second partially voided anti-pad having a second pattern and a second orientation;
   wherein the first orientation is offset from the second orientation.

9. The printed circuit board of claim 8, wherein the first and second partially voided anti-pads are configured to maintain planarity of the printed circuit board.

10. The printed circuit board of claim 8, wherein the first and second patterns are substantially identical.

11. The printed circuit board of claim 8, wherein the first and second partially voided anti-pads are configured for signals through the via signal barrel greater than approximately 2 GHz.

12. The printed circuit board of claim 8, wherein the first pattern comprises one of a symmetric pattern and an asymmetric pattern.

13. The printed circuit board of claim 8, wherein the first pattern comprises one of a concentric circles pattern, a radial spokes pattern, and an arbitrary pattern.

14. The printed circuit board of claim 8, wherein the first pattern comprises a screen pattern.

15. A printed circuit board comprising:
   a first conductive plane;
   a second conductive plane substantially parallel to the first conductive plane;
   a first via signal barrel transecting the first and second conductive planes;
   a first anti-pad positioned between the first conductive plane and the first via signal barrel, the first anti-pad having a first length and a first width and a first orientation; and
   a second anti-pad positioned between the second conductive plane and the first via signal barrel, the second anti-pad having a second length and a second width and a second orientation;
   wherein the first orientation is offset from the second orientation.

16. The printed circuit board of claim 15, wherein the first length and the first width are not equal.

17. The printed circuit board of claim 15, wherein the second length and the second width are not equal.

18. The printed circuit board of claim 15, wherein the first and second anti-pads are configured to maintain planarity of the printed circuit board.

19. The printed circuit board of claim 15, wherein the first and second anti-pads are configured for signals through the first via signal barrel greater than approximately 2 GHz.

20. The printed circuit board of claim 15, wherein the first length substantially equals the second length and the first width equals the second width.

21. The printed circuit board of claim 15, wherein the first and second anti-pads are substantially oval shaped.

22. The printed circuit board of claim 15, wherein the first orientation is substantially perpendicular to the second orientation.

23. The printed circuit board of claim 15, further comprising:
- a second via signal barrel parallel to the first via signal barrel and transecting the first and second conductive planes;
- a third anti-pad positioned between the second via signal barrel and the first conductive plane, the third anti-pad having a third orientation; and
- a fourth anti-pad positioned between the second via signal barrel and the second conductive plane, the fourth anti-pad having a fourth orientation;
- wherein the first and third orientations are substantially identical and adapted to allow a signal trace between the first and third anti-pads on an adjacent signal plane.

24. A method for forming a printed circuit board, comprising:
- providing a first conductive plane;
- providing a second conductive plane substantially parallel to the first conductive plane;
- forming a via signal barrel transecting the first and second conductive planes;
- forming a first anti-pad positioned between the first conductive plane and the via signal barrel, such that the first anti-pad has a first orientation and a first void; and
- forming a second anti-pad positioned between the second conductive plane and the via signal barrel, such that the second anti-pad has a second orientation and a second void;
- wherein the first orientation is offset from the second orientation; and
- wherein the first void does not completely overlap the second void.

25. The method of claim 24, wherein the first and second anti-pads are configured to maintain planarity of the printed circuit board.

26. The method of claim 24, wherein the first and second anti-pads are substantially oval shaped.

27. The method of claim 24, wherein the first and second anti-pads are partially voided in a pattern.

28. The method of claim 27, wherein the pattern comprises one of a symmetric pattern and an asymmetric pattern.

29. The method of claim 27, wherein the pattern comprises one of a concentric circles pattern, a radial spokes pattern, and an arbitrary pattern.

30. The method of claim 27, wherein the pattern comprises a screen pattern.

31. The method of claim 24, wherein the first and second anti-pads are configured for signals through the via signal barrel greater than approximately 2 GHz.

* * * * *